(12) United States Patent
Yu et al.

(10) Patent No.: US 7,420,275 B1
(45) Date of Patent: Sep. 2, 2008

(54) BORON-DOPED SIC COPPER DIFFUSION BARRIER FILMS

(75) Inventors: Yongsik Yu, Lake Oswego, OR (US); Atul Gupta, Fremont, CA (US); Karen Billington, Beaverton, OR (US); Michael Carris, Hillsboro, OR (US); William Crew, Portland, OR (US); Thomas W. Mountsier, San Jose, CA (US)

(73) Assignee: Novellus Systems, Inc., San Jose, CA (US)

( * ) Notice: Subject to any disclaimer, the term of this patent is extended or adjusted under 35 U.S.C. 154(b) by 349 days.

(21) Appl. No.: 11/373,847

(22) Filed: Mar. 8, 2006

Related U.S. Application Data

(60) Continuation-in-part of application No. 11/234,808, filed on Sep. 23, 2005, now Pat. No. 7,163,889, and a continuation-in-part of application No. 10/915,117, filed on Aug. 9, 2004, now Pat. No. 7,239,017, which is a division of application No. 10/670,660, filed on Sep. 24, 2003, now Pat. No. 6,967,405.

(51) Int. Cl.
*H01L 23/48* (2006.01)
*H01L 23/52* (2006.01)
*H01L 29/40* (2006.01)

(52) U.S. Cl. ............... 257/751; 257/760; 257/E21.576; 257/E21.584; 438/643; 438/653; 438/687; 438/627

(58) Field of Classification Search .................. 438/643, 438/653, 687, 627; 257/751, 760, E21.576, 257/E21.584
See application file for complete search history.

(56) References Cited

U.S. PATENT DOCUMENTS

| 4,177,474 | A | * | 12/1979 | Ovshinsky ............. 252/62.3 E |
| 4,656,110 | A |   | 4/1987  | Yamazaki |
| 5,034,355 | A | * | 7/1991  | Tani et al. ..................... 501/92 |
| 5,108,965 | A | * | 4/1992  | Tani et al. ..................... 501/92 |
| 5,324,690 | A |   | 6/1994  | Gelatos et al. |
| 5,464,699 | A | * | 11/1995 | Baldi ......................... 428/607 |
| 5,654,208 | A |   | 8/1997  | Harris et al. |
| 5,739,579 | A |   | 4/1998  | Chiang et al. |
| 5,958,324 | A | * | 9/1999  | Bujalski et al. ............. 264/470 |
| 6,045,877 | A |   | 4/2000  | Gleason et al. |
| 6,100,587 | A |   | 8/2000  | Merchant et al. |

(Continued)

OTHER PUBLICATIONS

U.S. Office Action mailed Feb. 9, 2007 for U.S. Appl. No. 10/869,474.

(Continued)

*Primary Examiner*—Michelle Estrada
*Assistant Examiner*—Jarrett J Stark
(74) *Attorney, Agent, or Firm*—Weaver Austin Villeneuve & Sampson LLP

(57) ABSTRACT

Copper diffusion barrier films having a boron-doped silicon carbide layer with at least 25% boron by atomic weight of the layer composition have advantages for semiconductor device integration schemes. The films have an integration worthy etch selectivity to carbon doped oxide of at least 10 to 1, can adhere to copper with an adhesion energy of at least 20 J/m$^2$, and can maintain an effective dielectric constant of less than 4.5 in the presence of atmospheric moisture. The films are suitable for use in a wide range of VLSI and ULSI structures and devices.

20 Claims, 2 Drawing Sheets

U.S. PATENT DOCUMENTS

| | | | |
|---|---|---|---|
| 6,159,871 A | 12/2000 | Laboda et al. | |
| 6,197,688 B1 | 3/2001 | Simpson | |
| 6,242,686 B1* | 6/2001 | Kishimoto et al. | 136/255 |
| 6,352,945 B1 | 3/2002 | Matsuki et al. | |
| 6,383,898 B1* | 5/2002 | Kishimoto | 438/482 |
| 6,383,955 B1 | 5/2002 | Matsuki et al. | |
| 6,399,484 B1 | 6/2002 | Yamasaki et al. | |
| 6,410,419 B1* | 6/2002 | Merchant et al. | 438/628 |
| 6,417,092 B1 | 7/2002 | Jain et al. | |
| 6,424,044 B1 | 7/2002 | Han et al. | |
| 6,432,846 B1 | 8/2002 | Matsuki | |
| 6,670,715 B2 | 12/2003 | Yang et al. | |
| 6,764,958 B1 | 7/2004 | Nemani et al. | |
| 6,774,489 B2 | 8/2004 | Russell et al. | |
| 6,790,767 B2 | 9/2004 | Lee | |
| 6,790,788 B2 | 9/2004 | Li et al. | |
| 6,855,645 B2 | 2/2005 | Tang et al. | |
| 6,881,683 B2 | 4/2005 | Matsuki et al. | |
| 6,890,850 B2 | 5/2005 | Lee et al. | |
| 6,967,405 B1 | 11/2005 | Yu et al. | |
| 7,064,088 B2 | 6/2006 | Hyodo et al. | |
| 7,163,889 B2 | 1/2007 | Yu et al. | |
| 2003/0001275 A1 | 1/2003 | Sambucetti et al. | |
| 2003/0057553 A1 | 3/2003 | DelaRosa et al. | |
| 2003/0068881 A1 | 4/2003 | Xia et al. | |
| 2003/0082296 A1 | 5/2003 | Elers et al. | |
| 2003/0089992 A1 | 5/2003 | Rathi et al. | |
| 2003/0194496 A1 | 10/2003 | Xu et al. | |
| 2003/0232514 A1 | 12/2003 | Kim et al. | |
| 2004/0067308 A1 | 4/2004 | Zheng et al. | |
| 2004/0084774 A1 | 5/2004 | Li et al. | |
| 2004/0113279 A1 | 6/2004 | Chen et al. | |
| 2004/0124531 A1 | 7/2004 | Venkatraman et al. | |
| 2004/0207084 A1 | 10/2004 | Hedrick et al. | |
| 2005/0014361 A1 | 1/2005 | Nguyen et al. | |
| 2005/0042889 A1 | 2/2005 | Lee et al. | |
| 2005/0202685 A1 | 9/2005 | Huang et al. | |
| 2005/0233555 A1 | 10/2005 | Rajagopalan et al. | |
| 2005/0236711 A1 | 10/2005 | Wang et al. | |
| 2005/0245071 A1 | 11/2005 | Wu et al. | |
| 2005/0277302 A1* | 12/2005 | Nguyen et al. | 438/763 |
| 2006/0110931 A1 | 5/2006 | Fukazawa et al. | |
| 2008/0070396 A1* | 3/2008 | Budrevich et al. | 438/592 |

OTHER PUBLICATIONS

Chattopadhyay et al. (Mar. 29, 2007), "Methods for Reducing UV and Dielectric Diffusion Barrier Interaction," U.S. Appl. No. 11/693,617.

Wu et al. (Oct. 17-19, 2006), "Ultra Low k Dielectrics Prepared by PECVD Using a Single-Precursor and Treated by UV Assisted Thermal Processing," Advanced Metallization Conference (AMC) 2006, pp. 1-6, San Diego, CA.

Wu et al. (Mar. 29, 2007), Methods for Improving Performance of ODC Films With Dielectric Constant.

Yu et al. (Feb. 22, 2007), "Improved Diffusion Barrier and Etch Stop Films," U.S. Appl. No. 11/710,652.

US Final Office Action (Jun. 28, 2007) from U.S. Appl. No. 10/869,474.

US Notice of Allowance (Jul. 26, 2007) from U.S. Appl. No. 10/869,474.

US Final Office Action (Sep. 7, 2006) from U.S. Appl. No. 10/915,117.

US Office Action (Sep. 6, 2006) from U.S. Appl. No. 10/869,474.

U.S. Office Action mailed Mar. 17, 2008 for U.S. Appl. No. 11/893,490.

U.S. Office Action mailed May 3, 2006, from U.S. Appl. No. 10/915,117.

Yu, et al., "Novel Film for Copper Diffusion Barrier", Novellus Systems, Inc., U.S. Appl. No. 11/234,808, filed Sep. 23, 2005, pp. 1-26.

Yu, et al., "Low-K B-Doped SIC Copper Diffusion Barrier Films", Novellus Systems, Inc., U.S. Appl. No. 10/915,117, filed Aug. 9, 2004, pp. 1-22.

Yu, et al., "Low-K SIC Copper Diffusion Barrier Films", Novellus Systems, Inc., U.S. Appl. No. 10/869,474, filed Jun. 15, 2004, pp. 1-25.

Masahiko Maeda, et al., "A Low-Permittivity Interconnection Using an SiBN Interlayer", Sep. 1989, IEEE Transactions on Electron Devices, vol. 36, No. 9.

Takashi Sugino, et al., "Synthesis of boron nitride film with low dielectric constant for its application to silicon ultralarge scale integrated semiconductors", 2001 Elsevier Science B.V., Diamond and Related Materials 1275-1379.

U.S. Office Action mailed Sep. 6, 2006, from related U.S. Appl. No. 10/869,474.

U.S. Office Action mailed Sep. 7, 2006, from corresponding U.S. Appl. No. 10/915,117.

U.S. Office Action mailed Dec. 11, 2006 from corresponding U.S. Appl. No. 10/915,117.

* cited by examiner

BORON-DOPED SIC COPPER DIFFUSION BARRIER FILMS

CROSS-REFERENCE TO RELATED APPLICATIONS

This application is a continuation-in-part of application Ser. No. 10/915,117 filed Aug. 9, 2004 now U.S. Pat. No. 7,239,017 and titled LOW-K B-DOPED SIC COPPER DIFFUSION BARRIER FILMS; and is a continuation-in-part of application Ser. No. 11/234,808 filed Sep. 23, 2005 now U.S. Pat. No. 7,163,889, titled NOVEL FILM FOR COPPER DIFFUSION BARRIER, which is a divisional of application Ser. No. 10/670,660 filed Sep. 24, 2003 now U.S. Pat. No. 6,967,405 and titled NOVEL FILM FOR COPPER DIFFUSION BARRIER. The disclosures of these prior applications are incorporated by reference herein in their entirety and for all purposes.

BACKGROUND

This invention relates to copper diffusion barrier film layers with advantageous physical and electrical properties for use in various applications, in particular as barrier films having high etch selectivity, good copper adherence and low dielectric constant for a wide range of VLSI and ULSI structures and devices.

As the features of microelectronic integrated circuits devices are reduced to smaller sizes, the electrical properties of the materials that constitute the devices will require change and improvement. One material that must be improved is the electrical insulator ("dielectric") used between the wires, metal lines, and other elements of the circuit. Without improvement in the insulator material, there will be increased problems due to capacitive effects such as coupling (crosstalk) and propagation delay. The speed at which future circuits will operate will be limited by RC delay in the interconnect.

These difficulties can be mitigated by preparing the circuit using an inter-layer dielectric ("ILD"), for example an inter-metal dielectric ("IMD"), having a dielectric constant that is as low as possible. The integration of Cu metal and IMD with a low dielectric constant continues to challenge the integrated circuit industry as device size and wiring dimensions are scaled down. Low dielectric constant (k) ("low-k"), insulators, with k significantly lower than that of presently used $SiO_2$ (3.9), are needed for reducing capacitive coupling and improving switching performance of future ULSI circuits. In this regard, the effective dielectric constant ($k_{eff}$) encountered by the signal in the interconnect structure is the most important parameter.

Cu/IMD integration schemes typically involve the incorporation of other materials along with the bulk inter-metal dielectric material, forming a stack. These other materials may include copper diffusion barrier, copper capping layer and hardmask (e.g., CMP and etch stop) materials needed to prevent copper poisoning of the bulk low-k dielectric, to protect the relatively soft low-k dielectric, and to facilitate the Damascene processing used in the device fabrication. These materials have a substantial impact on the effective k and overall performance of the IMD stack. Thus, the IMD must meet the dual challenges of minimizing the effective k of the stack while providing material selectivity with the use of reduced k etch stop, barrier and capping materials in a robust structure.

Silicon nitride (SiN) provides a film having satisfactory properties as a copper diffusion barrier, but its dielectric constant is relatively high. A recently developed PECVD SiC dielectric barrier is a promising candidate to replace SiN in many copper barrier applications because of its relatively low dielectric constant (k<4.5). However, existing PECVD SiC technology has shown limitations in achieving dielectric constants lower than 4.5 while continuing to maintain other integration requirements relating to line to line leakage, via poisoning, etch selectivity, Cu hillock formation and atmospheric moisture uptake. Improved materials and processing are required.

SUMMARY OF THE INVENTION

The present invention is mainly directed to copper diffusion barrier films suitable for a variety of copper/inter-metal dielectric integration schemes, including low dielectric constant IMD integration schemes, and methods of making and using them in semiconductor devices. The copper diffusion barrier films of the invention have a layer of boron-doped silicon-carbide, wherein boron comprises at least 25% by atomic weight of the layer composition, or between about 25 and 75% by atomic weight, for example about 50% by atomic weight of the layer composition. Suitable films are composed of one or more layers of silicon carbide, at least one of the silicon carbide layers having a boron-doped composition as follows: $Si_xB_yC_zH_w$, wherein $0<x<0.5$, $0<y<0.85$, $0<z<0.75$ and $0<w<0.5$; for example: Si:H:O:C:B=3:26:0:25:46.

Copper diffusion barrier films in accordance with the invention are hermetic and include a layer of boron-doped silicon-carbide having an integration worthy etch selectivity relative to carbon doped oxide of at least 10 to 1, e.g., at least 40 to 1, or 50 to 1, for example about 53 to 1. The films can adhere to copper with an adhesion energy of at least 20 $J/m^2$, and the copper adhesion is stable for at least 24 hours at temperatures and relative humidity from ambient up to 85° C. and 100% relative humidity. In addition, the barrier films can maintain an effective dielectric constant of less than 4.5 in the presence of atmospheric moisture.

The copper diffusion barrier films of the invention may be composed of a single boron-doped silicon carbide layer. According to this embodiment, a layer of boron-doped silicon carbide with the above-noted characteristics may be deposited as a copper diffusion barrier. Alternatively, the copper diffusion barrier films may be composed of multiple layers of silicon carbide having different compositions. The copper diffusion barrier film may have a thickness in the range of about 5 Å to 10000 Å.

In multi-layer copper diffusion barrier films of the invention, the composition of the layers may be tailored to provide additional functionality to the copper diffusion barrier film, and therefore to an IMD in which the copper diffusion barrier is incorporated. For example, undoped silicon carbide, nitrogen-doped silicon carbide and/or oxygen-doped silicon carbide layers may be incorporated into copper diffusion barrier film bi- or tri-layer stacks with boron-doped silicon carbide in accordance with the present invention to confer enhanced etch selectivity, copper adhesion and moisture absorption blocking. In this way, the invention provides effective low-k IMD/Cu integration schemes.

Copper diffusion barrier films in accordance with the invention may be formed by PECVD processes. In some embodiments, relatively high carbon (C) content organosilicon precursors not previously used in this application may be used. For example, conventional organisilicon precursors like tetramethylsilane may be used, or organisilicon precursors having at least 40% carbon (C), for example, between about 45 and 60% carbon (C) content may be used. Such high carbon content precursors (and their resulting barrier layer materials) will have a composition wherein the ratio of C to Si is greater than 2:1; or <3:1; or <4:1; or <5.1. Suitable high carbon organosilicon precursors may have at least 45%, 50% or 55% C and ratios of C:Si of at least 2:1 and as high as 5:1, or higher. In particular, high carbon organosilicon precursors such as ethynyltrimethylsilane, vinylphenylmethylsilane and phenyldimethylsilane, among others, may be used.

Other embodiments of the invention include a wholly or partially fabricated semiconductor device. The device includes a metal interconnect formed substantially of copper and a copper diffusion barrier adjacent the metal interconnect. The copper diffusion barrier is composed of one or more layers of silicon carbide, at least one of the silicon carbide layers having a composition as follows: $Si_xB_yC_zH_w$, wherein 0<x<0.5, 0<y<0.85, 0<z<0.75 and 0<w<0.5. The copper diffusion barrier films have an integration worthy etch selectivity to carbon doped oxide of at least 10 to 1, e.g., at least 40 to 1, or 50 to 1, for example about 53 to 1. The films can adhere to copper with an adhesion energy of at least 20 J/m$^2$, and the copper adhesion is stable for at least 24 hours at temperatures and relative humidity from ambient up to 85° C. and 100% relative humidity. In addition, the barrier films can maintain an effective dielectric constant of less than 4.5 in the presence of atmospheric moisture. In other such devices, the copper diffusion barrier films may be composed of multiple layers of silicon carbide having different compositions arranged to achieve effective low-k IMD/Cu integration schemes, as noted above.

Copper diffusion barrier films in accordance with the present invention can be formed by a method that includes the following operations: forming a trench in a first dielectric layer; forming a copper interconnect in the trench; and forming a copper diffusion barrier film on the copper interconnect, the copper diffusion barrier film comprising one or more layers of silicon carbide, at least one of the silicon carbide layers having a composition as follows: $Si_xB_yC_zH_w$, wherein 0<x<0.5, 0<y<0.85, 0<z<0.75 and 0<w<0.5.

The step of forming a copper diffusion barrier film involves a plasma-enhanced chemical vapor deposition ("PECVD") process using one or more organosilicon and boron precursor gases. The PECVD process may be performed in standard PECVD apparatus.

These and other features and advantages of the present invention will be described in more detail below with reference to the associated drawings.

DETAILED DESCRIPTION

Figure 1:
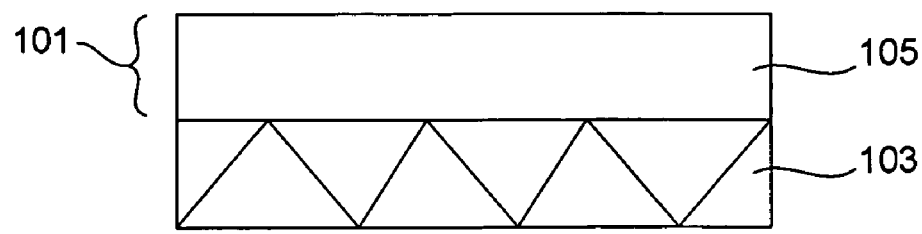
FIG. 1 illustrates a single layer copper diffusion barrier film in accordance with an embodiment of the present invention.

In the following description, the invention is presented in terms of certain specific compositions, configurations, and processes to help explain how it may be practiced. The invention is not limited to these specific embodiments. Examples of specific embodiments of the invention are illustrated in the accompanying drawings. While the invention will be described in conjunction with these specific embodiments, it will be understood that it is not intended to limit the invention to such specific embodiments. On the contrary, it is intended to cover alternatives, modifications, and equivalents as may be included within the scope and equivalents of the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

Introduction

The present invention is mainly directed to copper diffusion barrier films suitable for a variety of copper/inter-metal dielectric integration schemes, including low dielectric constant IMD integration schemes, and methods of making and using them in semiconductor devices. The copper diffusion barrier films of the invention have a layer of boron-doped silicon-carbide, wherein boron comprises at least 25% by atomic weight of the layer composition, or between about 25 and 75% by atomic weight, for example about 50% by atomic weight of the layer composition. Suitable films are composed of one or more layers of silicon carbide, at least one of the silicon carbide layers having a boron-doped composition as follows: $Si_xB_yC_zH_w$, wherein 0<x<0.5, 0<y<0.85, 0<z<0.75 and 0<w<0.5; for example: Si:H:O:C:B=3:26:0:25:46.

Copper diffusion barrier films in accordance with the invention are hermetic and include a layer of boron-doped silicon-carbide having an integration worthy etch selectivity relative to carbon doped oxide of at least 10 to 1, e.g., at least 40 to 1, or 50 to 1, for example about 53 to 1. The films can adhere to copper with an adhesion energy of at least 20 J/m$^2$, and the copper adhesion is stable for at least 24 hours at temperatures and relative humidity from ambient up to 85° C. and 100% relative humidity. In addition, the barrier films can maintain an effective dielectric constant of less than 4.5 in the presence of atmospheric moisture.

The term "semiconductor device" as used herein refers to any device formed on a semiconductor substrate or any device possessing a semiconductor material. In many cases, a semiconductor device participates in electronic logic or memory, or in energy conversion. The term "semiconductor device" subsumes partially fabricated devices (such as partially fabricated integrated circuits) as well as completed devices available for sale or installed in particular apparatus. In short, a semiconductor device may exist at any state of manufacture that employs a method of this invention or possesses a structure of this invention.

The copper diffusion barrier films of the invention may be composed of a single boron-doped silicon carbide layer. According to this embodiment, a layer of boron-doped silicon carbide with the above-noted characteristics may be deposited as a copper diffusion barrier. Alternatively, the copper diffusion barrier films may be composed of multiple layers of silicon carbide having different compositions. The copper diffusion barrier film may have a thickness in the range of about 5 Å to 10000 Å.

Low-k copper diffusion barrier films in accordance with the present invention may be formed by PECVD processes using novel organosilicon precursors not previously used in this application. In particular, carbon-rich organosilicon precursors such as ethynyltrimethylsilane, vinylphenylmethylsilane and phenyldimethylsilane, among others, may be used to achieve a low k barrier layer.

Barrier Films and Integration Schemes

Boron nitride films having a dielectric constant of approximately 2.7 have been prepared by atmospheric chemical vapor deposition ("CVD") at a high temperature. However, if exposed to air, these boron nitride films absorb moisture from the air and their dielectric constant increases substantially. Although boron-doped silicon nitride has a lower dielectric constant than pure silicon nitride, there are concerns that a $NH_3$-based process and/or a nitrogen containing plasma-based process such as SiBN could result in via poisoning and thus become unsuitable for use as a copper diffusion barrier for the next generation of semiconductor device.

It has been discovered that by carefully adjusting the stoichiometry between silicon carbide and boron carbide, plasma-deposited silicon boron carbide films having an integration worthy etch selectivity relative to carbon doped oxide of at least 10 to 1, e.g., at least 40 to 1, or 50 to 1, for example about 53 to 1 can be formed. An integration worthy etch is an etch using conditions suitable for use in semiconductor fabrication production schemes, such as a via etch process. It has also been found that such silicon boron carbide films can adhere to copper with an adhesion energy of at least 20 $J/m^2$ and that have a dielectric constant of less than 4.5. Surprisingly, these films have both good insulating properties and good moisture-blocking properties. Boron-doped silicon-carbide barrier films that have been shown to have these properties have a composition as follows: $Si_xByCzHw$, wherein $0<x<0.5$, $0<y<0.85$, $0<z<0.75$ and $0<w<0.5$. Suitable films have a layer of boron-doped silicon-carbide, wherein boron comprises at least 25% by atomic weight of the layer composition, or between about 25 and 75% by atomic weight, for example about 50% by atomic weight of the layer composition. One suitable film composition is Si:H:O:C:B=3:26:0:25:46.

The copper diffusion barrier films of the invention may be composed of a single boron-doped silicon carbide layer. According to this embodiment, a layer of boron-doped silicon carbide with a dielectric constant below 4.5 may be deposited, for example by plasma-enhanced chemical vapor deposition ("PECVD"), as a copper diffusion barrier. The copper diffusion barrier film may have a thickness in the range of about 5 Å to 10,000 Å.

For example, during a PECVD process, diborane ($B_2H_6$) mixed 5%/95% with an inert carrier gas, such as a noble gas, e.g., argon or helium, or with hydrogen, may be used as a boron precursor, and an organosilicon precursor may used as a silicon and carbon source. Those of skill in the art will realize that other substances may be used as boron, silicon and carbon precursors. In some embodiments, trimethylborate or borane complexes such as dimethylamine borane, triethylamine borane or nido-pentaborane may be used as boron precursors. Conventional organiosilicon precursors such as tetramethylsilane may be used. Alternatively, carbon-rich organosilicon precursors such as ethynyltrimethylsilane (ETMS), vinylpheylmethylsilane (VPMS), phenyldimethylsilane (DMPS), tri-iso-proplysilane, 3-(trimethylsilyl)cyclopentene, vinylphenyldimethylsilane, vinyldimethylsilane may be used. These precursors have at least 40% carbon (C), for example, between about 45 and 60% C and produce SiC films having that same proportion of carbon which have a dielectric constant significantly lower than that of films formed with the conventional tetramethylsilane (4MS) precursor. These carbon-rich precursors are further described in commonly-assigned co-pending application Ser. No. 10/869,474, incorporated herein by reference for all purposes.

Barrier films in accordance with the invention are formed from these precursor materials in various configurations. The films will generally have at least one boron-doped layer with a composition as follows: $Si_xByCzHw$, wherein $0<x<0.5$, $0<y<0.85$, $0<z<0.75$ and $0<w<0.5$. FIG. 1 shows an example of a single layer boron-doped barrier film 101 disposed on the surface of a copper layer 103, such as a metal line or via, in order to provide some context for how the film would be disposed when used in a semiconductor device. The film is composed of a layer of boron-doped silicon carbide with a composition as follows: $Si_xByCzHw$, wherein $0<x<0.5$, $0<y<0.85$, $0<z<0.75$ and $0<w<0.5$ 105 on the copper 103. Such a film has a k lower than 4.5 in the presence of atmospheric moisture.

Moreover, the advantageous properties of these boron-doped SiC (BDC) materials can be leveraged in accordance with the present invention to provide low-k copper barrier films with enhanced performance. In this regard, BDC is an excellent copper barrier, adheres strongly to copper, blocks moisture absorption, and provides good etch selectivity, UDC is very low k and provides good etch selectivity, ODC layers block moisture absorption and NDC enhances etch selectivity. Amine free UDC and ODC processing can eliminate via poisoning caused by amine contamination of the low k material during damascene processing. These layers, one or more of which is boron-doped, may be combined in a variety of configurations to form multi-layer, multi-functional (e.g., copper barrier, etch and/or CMP stop, moisture barrier) SiC barrier films, depending on the particular integration scheme, in accordance with the present invention. The composition and configuration of the layers may be tailored to provide additional functionality to the SiC-based copper diffusion barrier film, and therefore to an IMD in which the copper diffusion barrier film is incorporated. In this way, the invention provides effective low-k IMD/Cu integration schemes. Some examples of these multi-layer barrier films are illustrated in FIGS. 2A and B.

Figure 2A:
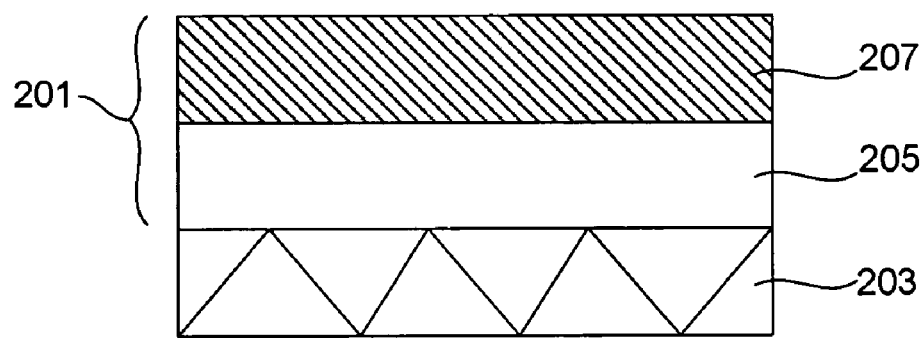
FIGS. 2A-B illustrate multi-layer configurations of copper diffusion barrier films in accordance with the present invention.

Referring to FIG. 2A, a BDC/ODC bi-layer copper diffusion barrier film in accordance with one embodiment of the present invention is shown. The barrier film 201 is shown disposed on the surface of a copper layer 203, such as a metal line or via, in order to provide some context for how the film would be disposed when used in a semiconductor device. The bi-layer film is composed of a layer of BDC 205 on the copper 203 and a layer of ODC 207 on the BDC. When the BDC layer 205 deposited between the freshly reduced Cu surface 203 and the ODC layer 207, it prevents copper migration, blocks moisture, provides good etch selectivity and prevents the freshly reduced Cu surface from being re-oxidized by the ODC layer and promotes adhesion of the SiC film to the copper. The ODC layer further blocks moisture absorption.

Since BDC and ODC films contain no amine (NH) source, the film will not cause any via poisoning during dual damascene integration. NDC films provide good etch selectivity to via/line dielectric films due to large compositional differences and good reliability due to stabilized Si—N and/or Si—C—N bonding. However, there are concerns that a $NH_3$-based process and/or a Nitrogen containing plasma based process such as NDC might result in via poisoning, and NDC films have shown higher k values than that of ODC, BDC or UDC films. It has been found that 200 Å or more of ODC or UDC layers are enough to prevent via poisoning no matter the thickness of the NDC layer, and the same is believed to be true for BDC.

Figure 2B:
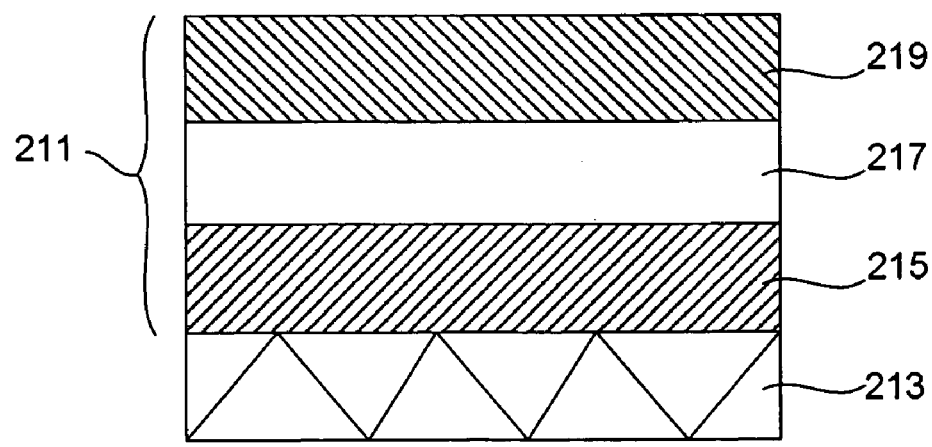

Referring the FIG. 2B, a BDC/NDC/ODC tri-layer copper diffusion barrier film in accordance with one embodiment of the present invention is shown. The tri-layer film is composed of a layer of BDC 215 on the copper 203, a layer of NDC on the BDC and a layer of ODC 207 on the BDC. According to this scheme, the BDC layer 215 provides an excellent copper barrier, the NDC layer 213 provides enhanced etch selectivity and the ODC layer blocks moisture absorption.

In other embodiments (not shown) a carbon-rich UDC layer may be deposited as part of a bi- or tri-layer stack to confer low k on the entire stack.

The thickness of each of the stack layer is determined by the application needs. The relative thickness of the UDC, NDC, ODC and/or BDC layers determines the k and the etch selectivity of the entire stack ($k_{eff}$). As noted above, the thickness of the film may be from about 5 to 10000 Å, for example about 500 Å. The relative thickness of the film layers may vary depending on the requirements of the integration. The k values of BDC, NDC, UDC, and ODC are precursor dependent and can be tuned by the choice of precursor (e.g., carbon-rich organosilicon precursors to lower k) and the stack combinations according to the overall performance requirements.

The step of forming a copper diffusion barrier film involves a plasma-enhanced chemical vapor deposition ("PECVD") process conducted in a PECVD reactor. The structure and operation of PECVD reactors are well known in the art. Suitable reactors for implementation of the present invention include the Sequel and Vector systems available from Novellus Systems, Inc of San Jose, Calif. The PECVD process may be performed, for example, at temperatures in the range of 200 to 425 degrees Centigrade and at pressures in the range of 0.1 torr to 10 torr. The resulting film is preferably in the range of about 5 angstroms to 10000 Å thick. The process may be conducted at relatively low frequencies (e.g., 200 to 500 kHz) or at relatively high frequencies (e.g., at approximately 13.56 MHz). Preferably, the copper is pretreated (e.g., with ammonia and/or nitrogen gas and/or helium gas and/or hydrogen gas) before film deposition.

The PECVD process may involve flowing an organosilicon precursor gas at rates in the range of approximately 50 to 2000 standard cubic centimeters per minute and/or a liquid precursor at rates in the range of approximately 0.3-5.0 ml per minute, for example, 0.5-3.0 ml/min, and flowing carrier gas e.g., He and/or $H_2$ and/or Ar in the range of approximately 0 to 10000 standard cubic centimeters per minute, for an undoped SiC (UDC) layer. A boron-doped SiC may be formed by additionally flowing up to 14000 sccm of diborane or other boron source, such as trimethylborate or borane complexes such as dimethylamine borane, triethylamine borane or nido-pentaborane. An oxygen doped SiC(ODC) layer may be formed by additionally flowing up to 1000 sccm of $O_2$ and/or other oxygen source, such as $CO_2$. A nitrogen doped SiC(NDC) layer may be formed by additionally flowing up to 5000 sccm of nitrogen ($N_2$), ammonia ($NH_3$) or other nitrogen source. The PECVD process may be performed at temperatures in the range of approximately 200 to 425° C. (e.g., 350° C.), at pressures in the range of approximately 0.1 torr to 10 torr (for example about 4-8 torr, e.g., 8 torr), at high frequency RF power of about 500-3000 W and low frequency RF power at 0-1000 W, and/or at frequencies in the range of approximately 200 to 500 kHz. Alternatively, the PECVD process may be performed at a frequency of approximately 13.56 MHz or 27 MHz.

Some exemplary methods use a flow rate in the range of 2000 to 10000 standard cubic centimeters per minute (sccm) of the boron precursor and 50 to 2000 sccm for the organosilicon precursor. According to one such method, a diborane/argon mixture (5%/95%) is introduced at approximately 500 sccm, while a tetramethylsilane is introduced at approximately 800 sccm.

Further, the method may involve flowing the organosilicon precursor as a gas and/or liquid, depending on the precursor delivery method, at rates in the range of approximately 50 to 2000 standard cubic centimeters per minute (gas) and/or 0.3~5.0 ml per minute (liquid) and/or flowing carrier gas e.g., He and/or $H_2$ and/or Ar in the range of approximately 0 to 9000 standard cubic centimeters per minute. According to one such method, a diborane/argon mixture (5%/95%) at a flow rate of about 4500 sccm, and phenyldimethylsilane at a flow rate of about 0.5 ml per minute may be used.

The method may also include a pretreatment for removing copper oxide from the copper layer prior to forming the copper diffusion barrier on the copper layer. The pretreatment may involve exposing the copper layer to ammonia and/or hydrogen gas and/or helium and/or a nitrogen plasma. In some instances, a post-treatment may also be conducted, for example, exposing an oxygen-doped silicon carbide layer to $CO_2$ gas and/or $O_2$ plasma to condition the surface to optimally block moisture absorption.

Other embodiments of the invention include a wholly or partially fabricated semiconductor device. The device includes a metal interconnect formed substantially of copper and a copper diffusion barrier adjacent the metal interconnect. The copper diffusion barrier is formed of single or multi-layer silicon carbide films as described above. In some such devices, the copper diffusion barrier film may be composed of a single boron-doped silicon carbide layer. In other such devices, the copper diffusion barrier films may be composed of multiple layers of silicon carbide having different compositions arranged to achieve effective low-k IMD/Cu integration schemes, as noted above.

Some aspects of the invention provide a method of forming at least a portion of a semiconductor device according to well known dual damascene fabrication techniques, but using the high carbon-content organosilicon precursors and integration schemes according to the present invention. The method includes the following steps: forming a trench in a first dielectric layer; forming a copper interconnect on the in the trench (which generally involves depositing a metal diffusion barrier in the trench and depositing a copper seed layer on the metal diffusion barrier); and forming a copper diffusion barrier in accordance with the present invention on the copper interconnect.

EXAMPLES

The following examples provide details relating to advantageous properties and performance characteristics of barrier layers in accordance with the present invention. It should be understood the following is representative only, and that the invention is not limited by any detail set forth in these examples.

Etch Selectivity

The etch selectivity relative to CDO (Si:H:O:C=23:28:33:16) was tested for two different boron doped SiC (BDC) films (BDC1, a hermetic film having the composition Si:H:O:C:B=3:26:0:25:46 and BDC2, a non-hermetic film having the composition Si:H:O:C:B=6:33:5:42:14, respectively) and several other materials including oxygen doped silicon carbide (ODC; Si:C:H:O=24:28:30:18), nitrogen doped silicon carbide (NDC, Si:C:H:N=26:23:25:26) and undoped silicon carbide (UDC, Si:C:H:O=12:54:32:2). The etch selectivity was tested using an integration worthy, namely an etch using conditions suitable for use in semiconductor fabrication production schemes, e.g., a damascene processing scheme. The test used a commercially available etch tool and process. In this particular example, a via etch process was used. A via etch process has the strictest selectivity requirements for the most common dual damascene integration scheme—via first.

The etch process conditions used for this test were typical of those used in production applications.

The results showed etch stop characteristics, in particular etch stop selectivity ratio with respect to low k material (CDO) after via opening in a damascene structure.

Etch selectivity results are shown in Table 1, below:

TABLE 1

| Film | Relative etch selectivity to low k material (CDO) |
|---|---|
| ODC | 33:1 |
| NDC | 30:1 |
| UDC | 33:1 |
| BDC1 | 53:1 |
| BDC2 | 27:1 |

As can be seen, the boron doped silicon carbide (BDC1) has highest etch selectivity, about 53 to 1 relative to CDO.

Copper Adhesion

Figure 3:
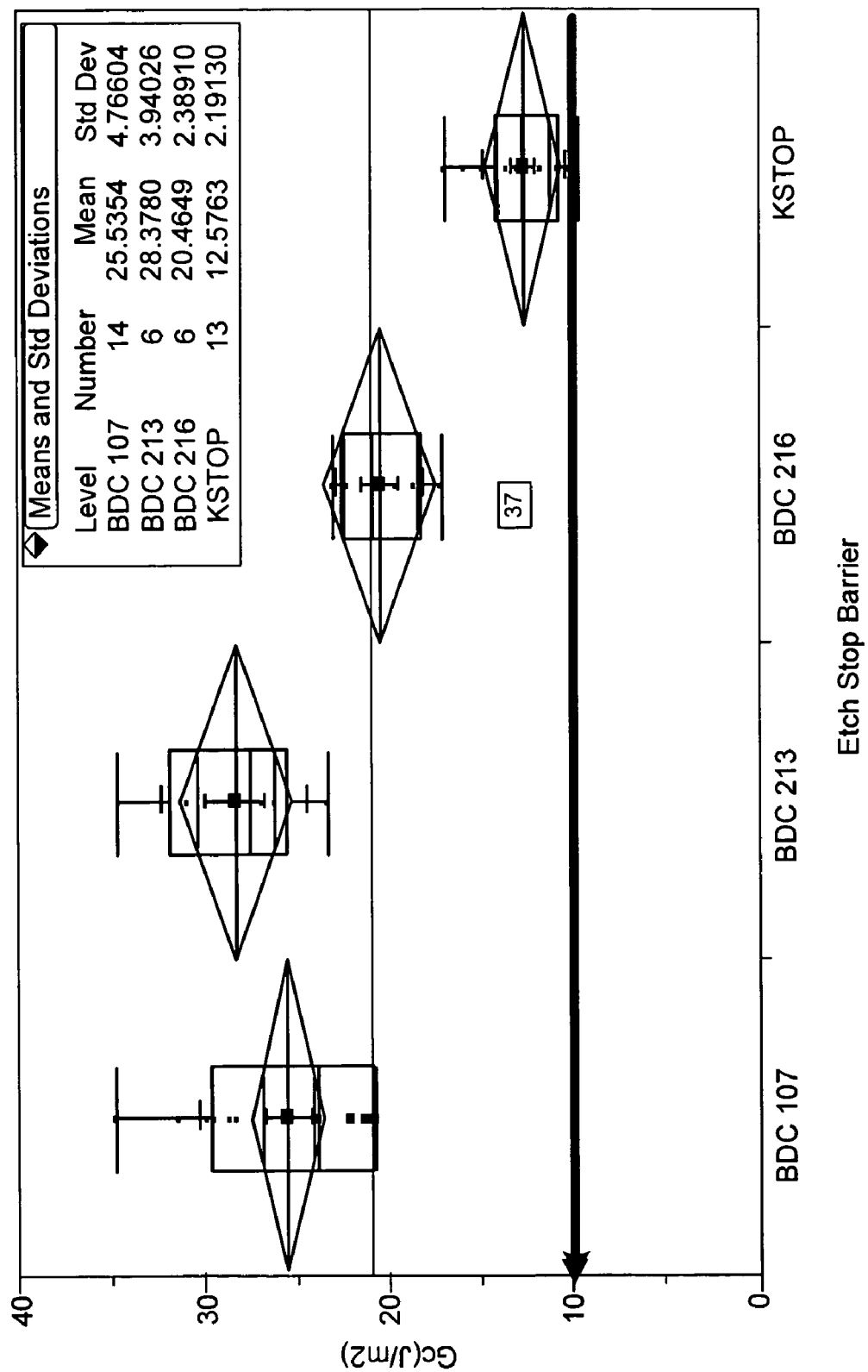
FIG. 3 depicts a plot of copper adhesion data for boron-doped silicon carbide layers in accordance with the present invention and a non-boron-doped layer.

The strength of the adhesion to copper of various hermetic boron doped silicon carbide (BDC) layers was measured relative to that of an NDC/ODC layer (KSTOP). Results are plotted in FIG. 3. The copper adhesion for the BDC is at least 20 J/m$^2$, significantly higher than the KSTOP adhesion of about 12 J/m$^2$. Accordingly, the use of the hermetic BDC results in a more robust barrier layer structure. This adhesion strength was found to be stable for at least 24 hours at temperatures and relative humidity from ambient up to 85° C. and 100% relative humidity.

CONCLUSION

Although the foregoing invention has been described in some detail for purposes of clarity of understanding, it will be apparent that certain changes and modifications may be practiced within the scope of the appended claims. It should be noted that there are many alternative ways of implementing both the process and compositions of the present invention. For example, while the invention has been described primarily in terms of preparing integrated circuits, it is not so limited. Accordingly, the present embodiments are to be considered as illustrative and not restrictive, and the invention is not to be limited to the details given herein, but may be modified within the scope and equivalents of the appended claims.

The entire disclosures of all references cited herein are incorporated by reference for all purposes.

It is claimed:

1. A copper diffusion barrier film for use in a semiconductor device, the copper diffusion barrier film comprising a layer of boron-doped silicon-carbide, wherein boron comprises at least 25% by atomic weight of the layer composition.

2. The barrier film of claim 1, wherein boron comprises between about 25 and 75% by atomic weight of the layer of boron-doped silicon-carbide of the copper diffusion barrier film.

3. The barrier film of claim 2, wherein boron comprises about 50% of the layer of boron-doped silicon-carbide of the copper diffusion barrier film.

4. The barrier film of claim 3, wherein the layer of boron-doped silicon-carbide of the copper diffusion barrier film has a composition as follows: Si:H:O:C:B=3:26:0:25:46.

5. The barrier film of claim 1, wherein the film is hermetic.

6. The barrier film of claim 1, wherein the film has an integration worthy etch selectivity to carbon doped oxide of at least 10 to 1.

7. The barrier film of claim 6, wherein the etch selectivity to carbon doped oxide is at least 40 to 1.

8. The barrier film of claim 7, wherein the etch selectivity to carbon doped oxide is at least 50 to 1.

9. The barrier film of claim 1, wherein the film adheres to copper with an adhesion energy of at least 20 J/m$^2$.

10. The barrier film of claim 9, wherein the copper adhesion of the film is stable for at least 24 hours at temperatures and relative humidity from ambient up to 85° C. and 100% relative humidity.

11. The barrier film of claim 1, wherein the film maintains an effective dielectric constant of less than 4.5 in the presence of atmospheric moisture.

12. The barrier film of claim 1, wherein the layer of boron-doped silicon-carbide of the copper diffusion barrier film has a composition that is oxygen-free.

13. The barrier film of claim 1, wherein the film is a single layer of boron-doped silicon carbide.

14. The barrier film of claim 1, wherein the film comprises a plurality of silicon carbide comprising layers forming a stack.

15. The barrier film of claim 14, wherein, in addition to the layer of boron-doped silicon carbide, the film stack comprises one or more additional layers selected from the group consisting of undoped silicon carbide, oxygen-doped silicon carbide and nitrogen-doped silicon carbide.

16. The barrier film of claim 15, wherein, in addition to the layer of boron-doped silicon carbide, the film stack comprises one layer selected from the group consisting of undoped silicon carbide, oxygen-doped silicon carbide and nitrogen-doped silicon carbide.

17. The barrier film of claim 14, wherein the film stack comprises:
    a first layer of undoped silicon carbide; and
    a second layer of boron-doped silicon carbide also comprising one or more elements selected from the list of elements consisting of hydrogen, nitrogen and oxygen.

18. The barrier film of claim 17, further comprising a third layer of boron-doped silicon carbide, different in composition form the second layer, also comprising one or more elements selected from the list of elements consisting of hydrogen, nitrogen and oxygen.

19. The barrier film of claim 14, wherein the film stack comprises a layer of oxygen-doped silicon carbide and the layer of oxygen-doped silicon carbide is not the bottom layer of the stack disposed adjacent to the copper.

20. A semiconductor device, comprising:
    a metal interconnect formed substantially of copper; and
    a copper diffusion barrier film in accordance with claim 1 adjacent to the metal interconnect.

* * * * *